(12) United States Patent
Liu et al.

(10) Patent No.: US 10,731,973 B2
(45) Date of Patent: Aug. 4, 2020

(54) APPARATUS FOR AUTOMATICALLY AND QUICKLY DETECTING TWO-DIMENSIONAL MORPHOLOGY FOR WAFER SUBSTRATE IN REAL TIME

(71) Applicant: AK OPTICS TECHNOLOGY CO., LTD., Beijing (CN)

(72) Inventors: Jianpeng Liu, Beijing (CN); Tang Zhang, Beijing (CN); Chengmin Li, Beijing (CN)

(73) Assignee: AK OPTICS TECHNOLOGY CO., LTD., Beijing (CN)

(*) Notice: Subject to any disclaimer, the term of this patent is extended or adjusted under 35 U.S.C. 154(b) by 358 days.

(21) Appl. No.: 16/319,322

(22) PCT Filed: Aug. 19, 2014

(86) PCT No.: PCT/CN2014/084684
§ 371 (c)(1),
(2) Date: Jan. 19, 2019

(87) PCT Pub. No.: WO2015/169007
PCT Pub. Date: Nov. 12, 2015

(65) Prior Publication Data
US 2019/0162527 A1    May 30, 2019

(30) Foreign Application Priority Data

May 6, 2014    (CN) .......................... 2014 1 0188236

(51) Int. Cl.
*G01B 11/245* (2006.01)
*G01N 21/956* (2006.01)
*G01B 11/255* (2006.01)
*H01L 21/66* (2006.01)
*G01N 21/95* (2006.01)
*H01L 33/00* (2010.01)
*H01L 33/20* (2010.01)

(52) U.S. Cl.
CPC .......... *G01B 11/245* (2013.01); *G01B 11/255* (2013.01); *G01N 21/9501* (2013.01);
(Continued)

(58) Field of Classification Search
CPC ................ G01B 11/245; G01B 11/255; G01N 21/9501; G01N 21/956; H01L 22/12; H01L 22/30; H01L 33/005; H01L 33/20
(Continued)

(56) References Cited

U.S. PATENT DOCUMENTS

| | | | |
|---|---|---|---|
| 5,912,738 A * | 6/1999 | Chason | G01B 11/255 356/601 |
| 7,505,150 B2 * | 3/2009 | Zettler | G01B 11/24 356/601 |

(Continued)

FOREIGN PATENT DOCUMENTS

| CN | 102023068 A | 4/2011 |
|---|---|---|
| CN | 102620868 A | 8/2012 |

OTHER PUBLICATIONS

Chinese Office Action dated Apr. 19, 2017 for the corresponding patent application in China.

*Primary Examiner* — Roy M Punnoose
(74) *Attorney, Agent, or Firm* — Platinum Intellectual Property LLP

(57) ABSTRACT

A device for detecting a two-dimensional morphology of a wafer substrate in real time. The device comprises: a first calculation module, a second calculation module and an analysis module, wherein the first calculation module calculates the curvature $C_X$ between any two points of incidence on the wafer substrate in an X direction of a substrate to be detected according to position signals of N light spots; the second calculation module calculates the curvature $C_Y$ at any one point of incidence on the wafer substrate in a moving direction, i.e. a Y direction, of the substrate to be detected according to the position signals of N light spots. The device can be adapted to a sapphire substrate on a graphite disc which rotates at a high speed.

18 Claims, 2 Drawing Sheets

(52) U.S. Cl.
CPC ........... *G01N 21/956* (2013.01); *H01L 22/12* (2013.01); *H01L 22/30* (2013.01); *H01L 33/005* (2013.01); *H01L 33/20* (2013.01); *G01B 2210/56* (2013.01)

(58) Field of Classification Search
USPC ........................................................ 356/601
See application file for complete search history.

(56) References Cited

U.S. PATENT DOCUMENTS

| | | | | |
|---|---|---|---|---|
| 7,751,046 | B2* | 7/2010 | Levy | G01N 21/211 |
| | | | | 356/237.1 |
| 8,514,408 | B2* | 8/2013 | Zettler | G01B 11/25 |
| | | | | 356/612 |
| 8,810,798 | B2* | 8/2014 | Zettler | H01L 22/12 |
| | | | | 356/601 |
| 9,970,880 | B2* | 5/2018 | Chen | G01B 11/24 |
| 10,283,419 | B2* | 5/2019 | Lacroix | G01B 11/24 |
| 2003/0227618 | A1* | 12/2003 | Some | G01N 21/9501 |
| | | | | 356/237.1 |
| 2006/0241891 | A1* | 10/2006 | Kaushal | H01L 21/67248 |
| | | | | 702/136 |
| 2013/0021610 | A1* | 1/2013 | Zettler | H01L 22/12 |
| | | | | 356/369 |
| 2016/0169666 | A1* | 6/2016 | Chen | G01B 11/2513 |
| | | | | 356/601 |
| 2017/0205342 | A1* | 7/2017 | Krishnan | G01J 3/36 |
| 2018/0052115 | A1* | 2/2018 | Chen | G01B 11/24 |
| 2018/0238814 | A1* | 8/2018 | Sapiens | G01J 3/0224 |

* cited by examiner

APPARATUS FOR AUTOMATICALLY AND QUICKLY DETECTING TWO-DIMENSIONAL MORPHOLOGY FOR WAFER SUBSTRATE IN REAL TIME

RELATED APPLICATIONS

100001 This application is a United States National Stage Application filed under 35 U.S.C 371 of PCT Patent Application Serial No. PCT/CN2014/084684, filed Aug. 19, 2014, which claims Chinese Patent Application Serial No. CN 201410188236.2, filed May 6, 2014, the disclosure of all of which are hereby incorporated by reference in their entirety.

TECHNICAL FIELD

The disclosure relates to the technical field of non-destructive detection of semiconductor materials, and in particular to an apparatus for automatically and quickly detecting a two-dimensional morphology of a wafer substrate in real time.

BACKGROUND OF THE INVENTION

A main process for producing LEDs today involves a process of metal organic chemical vapor deposition (MOCVD). The process is to grow a quantum well film on a sapphire substrate at several high temperatures. A size of the substrate limits the efficiency of LED production. A current mature technology is to grow quantum well films on 2-inch substrates. If the size of the sapphire substrate is increased from 2 inches to 6 inches, the productivity of LED will be increased by 30%. However, since thermal expansion coefficients of the quantum well film and the sapphire substrate are inconsistent, when the size of the sapphire substrate is increased, a large-sized sapphire substrate is significantly deformed at the time of high temperature growth. Due to such obvious deformation, the sapphire substrate cannot be in perfect contact with a graphite disc, resulting in uneven temperature distribution on the sapphire substrate. A maximum difference in temperature can reach 10° C. The difference in temperature will eventually cause the quantum wells grown at different positions on the sapphire substrate to have different radiation spectrums. The difference in radiation spectrum caused by the difference in temperature can reach 14 nm. This is unacceptable for LED lighting. In order to obtain a quantum well film of uniform thickness, it is necessary to study the two-dimensional morphology of the sapphire substrate and determine a numerical relationship between the two-dimensional morphology and the temperature distribution of the sapphire substrate. At present, there are many methods for detecting the two-dimensional morphology of the sapphire substrate, but only the method of laser macroscopic deformation analysis can be used for real-time and rapid detection of the two-dimensional morphology of the sapphire substrate. The method of laser macroscopic deformation analysis enables two parallel laser beams with known distance to irradiate on a surface of the sapphire substrate. Due to different morphology on the surface of the sapphire substrate, reflection angles of the two laser beams are different. The two laser beams are respectively received by CCDs at known distances from points of incidence of the laser beams, and the CCDs can acquire positions of light spots of the two laser beams. A distance D between the two light spots can be obtained by an image processing method, in combination with a distance d between the two laser beams before arriving at the substrate and a distance Z from the points of incidence to the CCD, a curvature of an arc between the points of incidence of the two laser beams on the sapphire substrate can be calculated.

However, in the MOCVD process, a growth rate of the quantum well film has been greatly improved with the increase of a rotational speed of a graphite disc of the substrate bearing the growth of a wafer epitaxial film, and due to the limitation of a minimum integration time and a reading speed of the CCD, a CCD-based detection technique has been insufficient for detecting a sapphire substrate on a high-speed rotating graphite disc.

SUMMARY OF THE INVENTION

In order to solve the above problems, the present disclosure proposes an apparatus for automatically and quickly detecting a two-dimensional morphology of a wafer substrate in real time which is capable of being adaptable to a sapphire substrate on a high speed rotating graphite disc.

The apparatus for automatically and quickly detecting a two-dimensional morphology of a wafer substrate in real time may comprise a first calculation module, a second calculation module and an analysis module, wherein:

the first calculation module calculates a curvature $C_X$ between any two points of incidence on the wafer substrate in an X direction of a substrate to be detected according to position signals of N light spots;

the second calculation module calculates a curvature $C_Y$ of any point of incidence on the wafer substrate in a moving direction, i.e., a Y direction of the substrate to be detected according to the position signals of the N light spots, wherein N is a natural number of 3 or more, and the N light spots are formed by N laser beams which are incident on the wafer substrate in a radial direction, i.e., the X direction, of the wafer substrate, and then respectively reflected onto PSDs (Position Sensitive Device) which correspond to incident light beams one to one; and the analysis module obtains the two-dimensional morphology of the substrate according to calculation results of the respective $C_X$ and $C_Y$.

The apparatus for quickly detecting the two-dimensional morphology of the wafer substrate in real time according to the disclosure adopts PSD as a photoelectric conversion device, and as the substrate moves, the curvature $C_Y$ of any point of incidence on the wafer substrate in the moving direction, i.e., the Y direction of the substrate to be detected can be obtained. Moreover, the curvature $C_X$ between two light spots in the arrangement direction of the incident light, that is, the X direction, can be obtained. According to the calculation results of the respective $C_X$ and $C_Y$, the two-dimensional morphology of the wafer substrate can be finally obtained. Since the PSD is made based on a silicon photodiode, there is real-time photoelectric conversion. Therefore a data readout speed of this solution of the disclosure depends on the readout speed of the data acquisition card. For example, when there are five test points in the arrangement direction of the incident light, for a same circuit, a data readout frequency of a PSD is F, so a total readout frequency is F/15; in contrast, for a CCD, according to pixels of general CCDs, to achieve the effect achieved through a PSD, it requires a minimum of pixels of 512× 512=262144, thus the readout frequency based on a CCD is F/262144. Therefore, the data readout speed of a scheme of PSD is theoretically 17476 times that of a scheme of CCD, and thus the scheme of PSD is adaptable to a sapphire substrate on a high speed rotating graphite disc.

DETAILED DESCRIPTION OF THE INVENTION

The present invention will be described in detail below in conjunction with accompanying drawings and specific embodiments for an in-depth understanding of the invention.

Figure 1:
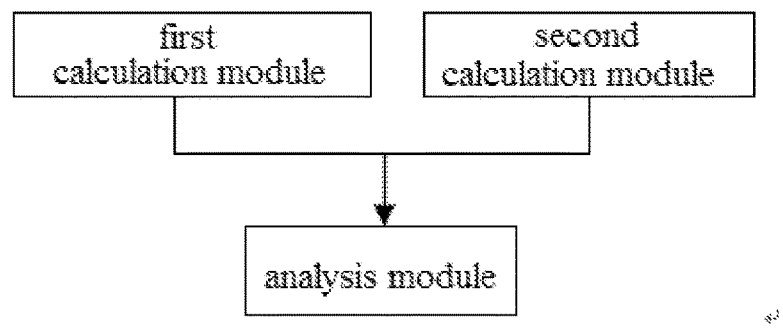
FIG. 1 is a schematic diagram showing the relationship among modules of an apparatus for automatically and quickly detecting a two-dimensional morphology of a wafer substrate in real time according to an embodiment of the present invention.

Referring to FIG. 1, an apparatus for automatically and quickly detecting a two-dimensional morphology of a wafer substrate in real time according to an embodiment of the present disclosure may comprise a first calculation module, a second calculation module, and an analysis module.

The first calculation module calculates a curvature $C_X$ between any two points of incidence on a wafer substrate in an X direction of a substrate to be detected according to position signals of N light spots.

The second calculation module calculates a curvature $C_Y$ of any point of incidence on the wafer substrate in a moving direction, i.e., a Y direction of the substrate to be detected according to the position signals of N light spots.

In some embodiments, N is a natural number of 3 or more, and the N light spots are formed by N laser beams which are incident on the wafer substrate in a radial direction, i.e., the X direction, of the wafer substrate, and then respectively reflected onto PSDs (position sensitive devices) which have a one-to-one correspondence with incident light beams.

The analysis module obtains the two-dimensional morphology of the substrate according to calculation results of the respective $C_X$ and $C_Y$.

In some embodiments, the apparatus for automatically and quickly detecting a two-dimensional morphology of a wafer substrate in real time may further comprise a data acquisition module. The data acquisition module is configured to acquire horizontal coordinates of respective light spots and transmit the horizontal coordinates of the respective light spots to the first calculation module and the second calculation module. Therefore, it is not necessary to manually input the horizontal coordinates of respective light spots, so that the apparatus for automatically and quickly detecting a two-dimensional morphology of a wafer substrate in real time according to the disclosure has a high level of automation.

In some embodiments, the apparatus for automatically and quickly detecting a two-dimensional morphology of a wafer substrate in real time according to the disclosure further comprises a data acquisition module. The data acquisition module is configured to acquire horizontal coordinates and longitudinal coordinates of the respective light spots, and respectively transport the horizontal coordinates and the longitudinal coordinates of the respective light spots to the first calculation module and the second operational module. Due to the introduction of the data acquisition module, the horizontal coordinates of the respective light spots can be automatically transported to the first calculation module and the second calculation module, thereby avoiding manual input, which can realize a higher automation level and a higher accuracy.

First Embodiment

Figure 2:
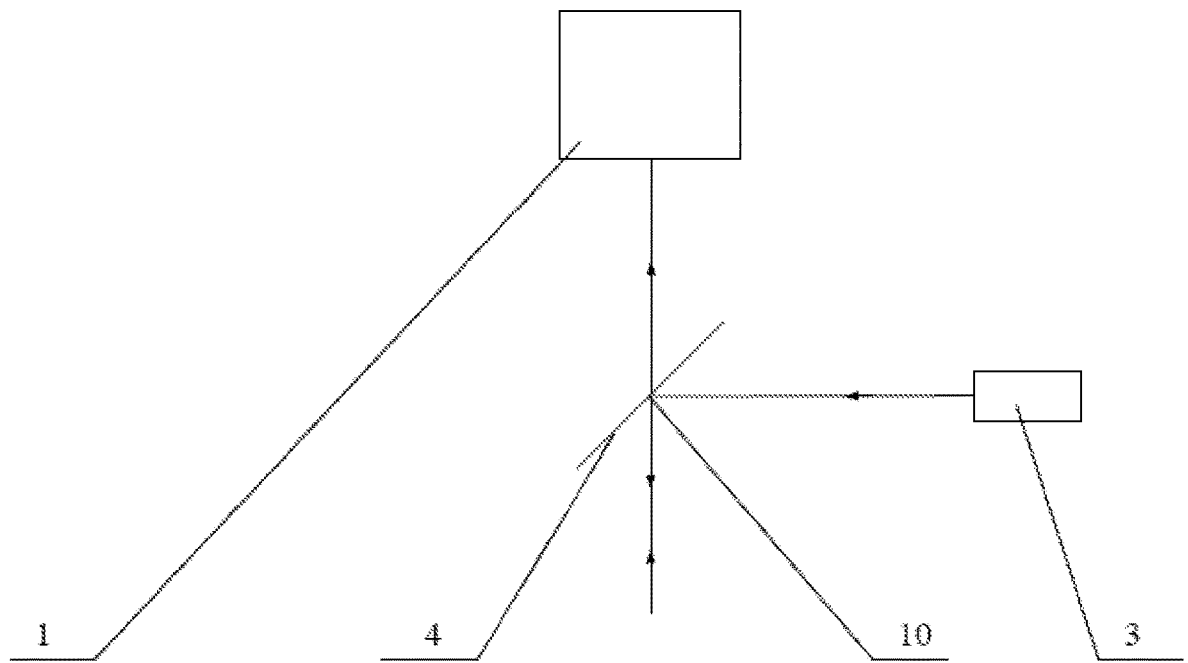
FIG. 2 is a schematic diagram showing an optical path according to a first embodiment of an apparatus for automatically and quickly detecting a two-dimensional morphology of a wafer substrate in real time provided by the present invention.

For easy understanding, FIG. 2 only shows an optical path of one of light spots.

Referring to FIG. 2, an apparatus for quickly detecting a two-dimensional morphology of a wafer substrate in real time according to a first embodiment of the invention may comprise N PSDs 1, N laser beams and a first beam-splitting element 4. The N laser beams are arranged linearly, wherein N is a natural number of 3 or more, and there is a one-to-one correspondence between the N PSDs 1 and the N laser beams.

The N laser beams first irradiates on a position 10 of a first beam-splitting element 4, and form an incident light after passing through the first beam-splitting element 4. The incident light is incident on a wafer substrate, and forms N points of incidence on the wafer substrate in a radial direction, and then the incident light is reflected by the substrate to form N first reflected light beams. The respective first reflected light beams are transmitted through the first beam-splitting element, and then incident on PSDs 1 corresponding to the N laser beams to form N light spots.

As a specific way of forming N laser beams, the N laser beams may be emitted from N first lasers 3, and the N first lasers 3 constitute an array of lasers.

In some embodiments, N is a natural number of 5 or more, and when N is a natural number of 5 or more, the number of light spots that can be formed also increases.

For easy understanding, a method for detecting a two-dimensional morphology of a wafer substrate for growing an epitaxial film is described simply by taking N=5 as an example:

when N=5, five light spots A, B, C, D and E are formed, and the corresponding PSDs are $PSD_A$, $PSD_B$, $PSD_C$, $PSD_D$ and $PSD_E$, respectively.

First, a planar reflection surface is used instead of the wafer to perform a calibration. The following parameters are set: a light spot formed by a laser beam hitting on the planar reflection surface and then being reflected onto the $PSD_A$ has a horizontal coordinate of $x_{10}$; a light spot formed by a laser beam hitting on the planar reflection surface and then being reflected onto the $PSD_B$ has a horizontal coordinate of $x_{20}$; a light spot formed by a first reflected light beam being transmitted through the first beam-splitting element and then projected onto the $PSD_A$ has a horizontal coordinate of $x_{11}$; and a light spot formed by the first reflected light beam being transmitted through the first beam-splitting element and then projected onto the $PSD_B$ has a horizontal coordinate of $x_{21}$; $d_{AB}=x_{20}-x_{10}$; a distance from $PSD_A$ to the substrate is $y_{10}$; and a distance from $PSD_B$ to the wafer substrate for growing an epitaxial film is $y_{20}$.

According to the above parameters including $x_{10}$, $x_{20}$, $x_{11}$, $x_{21}$, $y_{10}$, $y_{20}$ and $d_{AB}$, a curvature between the light spots A and B in an arrangement direction of the incident light, that is, the X direction, can be calculated:

$$C_X = \frac{(x_{21} - x_{20})}{2 \cdot d_{AB} \cdot y_{20}} - \frac{(x_{11} - x_{10})}{2 \cdot d_{AB} \cdot y_{10}}$$

Similarly, a curvature between any two points of incidence on the wafer substrate in the arrangement direction of the incident light, i.e., the X direction, can be obtained respectively.

In some embodiments, when the curvature $C_X$ between any two points of incidence on a sample in the arrangement direction of the incident light, that is, the X direction, is calculated, $x_{10}$, $x_{20}$, $d_{AB} \times y_{10}$ and $d_{AB} \times y_{20}$ need to be calibrated. At this time, a planar mirror ($C_X=0$, $C_Y=0$) can be first placed on a graphite disc for bearing a substrate to be detected to obtain values of $x_{10}$ and $x_{20}$, and then two mirrors having known curvatures $C_X$ are sequentially placed to perform calibration so as to obtain true values of $d_{AB} \cdot y_{20}$ and $d_{AB} \cdot y_{10}$ at the time of detecting the substrate. At the time of detection, since $x_{10}$, $x_{20}$, $d_{AB} \cdot y_{20}$ and $d_{AB} \cdot y_{10}$ are all calibrated true values, systematic errors are avoided.

It is supposed that a sampling frequency of PSD 1 is set as f; the graphite disc bearing the substrate has revolutions per minute of RPM; k is a linearly fitted slope of longitudinal coordinates of light spots on PSDs 1 varying with time; and a calibration coefficient is α, thus a curvature $C_Y$ of any point of incidence in a moving direction, i.e., the Y direction of the substrate to be detected can be calculated as below:

$$C_Y = \frac{15f}{\pi} \cdot \frac{k}{RPM \cdot \alpha}.$$

In some embodiments, the calibration coefficient α needs to be calibrated, when the curvature of any point of incidence on the wafer substrate in the moving direction, i.e., the Y direction, of the substrate to be detected, is calculated. At this time, a standard sample with known curvature is placed on the graphite disc and rotates at a constant speed, and a corresponding slope k of the standard sample is measured. Thus the calibration coefficient α can be calculated. At the time of detection, since α is a true value obtained by calibration, systematic errors are avoided.

According to the above data of $C_X$ and $C_Y$, the two-dimensional morphology of the substrate to be detected can be determined.

The apparatus for quickly detecting the two-dimensional morphology of the wafer substrate in real time according to the disclosure adopts PSD as a photoelectric conversion device, and as the substrate moves, the curvature $C_Y$ of any point of incidence on the wafer substrate in the moving direction, i.e., the Y direction of the substrate to be detected can be obtained. Moreover, the curvature $C_X$ between two light spots in the arrangement direction of the incident light, that is, the X direction, can be obtained. According to the calculation results of the respective $C_X$ and $C_Y$, the two-dimensional morphology of the wafer substrate can be finally obtained. Since the PSD is made based on a silicon photodiode, there is real-time photoelectric conversion. Therefore a data readout speed of this solution of the disclosure depends on the readout speed of the data acquisition card. For example, when there are five test points in the arrangement direction of the incident light, for a same circuit, a data readout frequency of a PSD is F, so a total readout frequency is F/15; in contrast, for a CCD, according to pixels of general CCDs, to achieve the effect achieved through a PSD, it requires a minimum of pixels of 512×512=262144, thus the readout frequency based on a CCD is F/262144. Therefore, the data readout speed of a scheme of PSD is theoretically 17476 times that of a scheme of CCD, and thus the scheme of PSD is adaptable to a sapphire substrate on a high speed rotating graphite disc.

Second Embodiment

Figure 3:
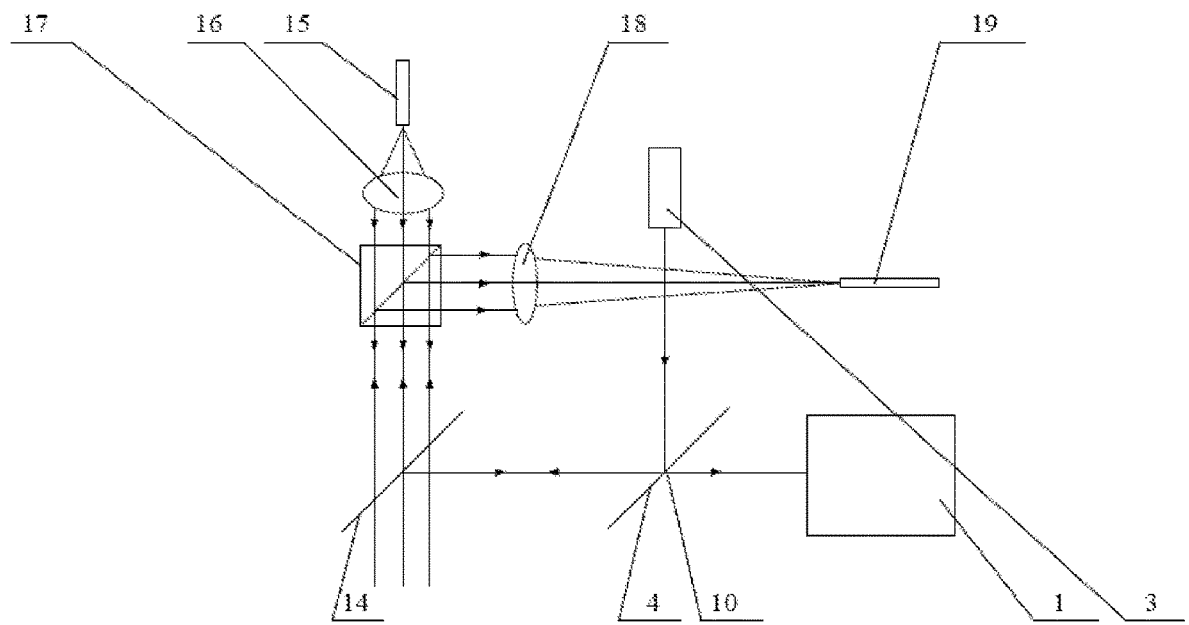
FIG. 3 is a schematic diagram showing an optical path of a second embodiment of an apparatus for automatically and quickly detecting a two-dimensional morphology of a wafer substrate in real time provided by the present invention.

For easy understanding, FIG. 3 only shows an optical path of one of light spots.

Referring to FIG. 3, an apparatus for quickly detecting a two-dimensional morphology of a wafer substrate in real time according to the second embodiment of the present invention differs from the apparatus for quickly detecting a two-dimensional morphology of a wafer substrate in real time according to the first embodiment of the present invention in that it further comprises a second beam-splitting element 14 and a temperature measurement device. N laser beams are reflected by the first beam-splitting element 4 and then incident on the second beam-splitting element 14, and then passes through the second beam-splitting element 14 to form an incident light, and the incident light is incident on the wafer substrate to form N points of incidence on the wafer substrate in a radial direction. The incident light, after being reflected by the substrate forms N first reflected light beams, and the respective first reflected light beams pass through the second beam-splitting element 14 and the first beam-splitting element 4, and then are incident on the PSDs 1 corresponding to the N laser beams to form N light spots.

The temperature measurement device comprises a laser emitting device, a third beam-splitting element 17, and a laser receiving device. A first parallel light emitted by the laser emitting device is transmitted through the third beam-splitting element 17, and then transmitted through the second beam-splitting element 14 to radiate on a wafer substrate, and then reflected by the substrate to form a second reflected light beam. The second reflected light beam is transmitted through the second beam-splitting element 14, and then is reflected by the third beam-splitting element 17 to form a second parallel light beam, and the second parallel light beam is received by the laser receiving device.

With the apparatus for quickly detecting a two-dimensional morphology of a wafer substrate in real time according to the second embodiment of the present invention with the addition of the above components by means of a function of coupling of the second beam-splitting element 14, not only the two-dimensional morphology of the wafer substrate for growing an epitaxial film can be detected quickly in real time, but also a temperature of the wafer substrate for growing the epitaxial film can be detected quickly in real time, thereby obtaining two-dimensional morphologies of the substrate at different temperatures during the process of epitaxial growth of the wafer, and providing data for finding the relationship between the morphology of the substrate and the temperature distribution of the substrate.

As a specific implementation of the laser emitting device, the laser emitting device may comprise a second laser, a launching fiber 15 and a first lens 16. The launching fiber 15 is at a focus of a launching end of the first lens 16, so that a divergent light emitted by the launching fiber 15 is refracted by the first lens 16 to become a first parallel light. As a specific implementation of the laser receiving device, the laser receiving device may include a second lens 18, a receiving fiber 19 and a detector, and the receiving fiber 19 is located at a focus of a receiving end of the second lens 18, so that a second parallel light is refracted by the second lens 18 and then converged to the receiving fiber 19 to facilitate detection by the detector.

In some embodiments, a core diameter of the receiving fiber 19 may be larger than that of the launching fiber 15. The larger the core diameter of the fiber is, the greater the intensity of light that can be received is. When the core diameter of the receiving fiber 19 is larger than the core diameter of the launching fiber, it can be ensured that the light obtained after the second parallel light beam is refracted by the second lens 18 can be completely received by the receiving fiber 19, so that a better stability of system can be obtained.

In an embodiment, a splitting ratio of the first beam-splitting element 4 may be 50% transmittance versus 50% reflectance. In the apparatus for quickly detecting a two-dimensional morphology of a wafer substrate in real time according to the first and second embodiments of the present invention, a reflected light obtained through the first beam-splitting element 4 is the light for being incident on the substrate, and a transmitted light obtained through the first beam-splitting element 4 is the light for being projected onto PSDs 1. For the first beam-splitting element 4, the reflecting effect and the transmitting effect are equally important, and therefore, the first beam-splitting element 4 needs to be designed to have a 50% transmittance and a 50% reflectance.

The splitting ratio of the second beam-splitting element 14 may be 92% transmittance versus 8% reflectance. In the second embodiment of the present invention, the second beam-splitting element is a medium that couples an apparatus for quickly detecting a two-dimensional morphology of a wafer substrate in real time and a device for detecting a temperature of a substrate for growing an epitaxial film. When a temperature of a substrate for growing an epitaxial film is detected, if only the light incident on the substrate is strong enough, it could be in favor of the acquisition of a black-body thermal radiation value $P_b(\lambda, T)$ of the substrate and a thermal radiation intensity $L(\lambda, T)$ of the substrate, thereby a temperature of the substrate for growing an epitaxial film can be detected. Therefore, the second beam-splitting element 14 needs to be designed to have a 92% transmittance and an 8% reflectance.

The splitting ratio of the third beam-splitting element 17 may be 50% transmittance versus 50% reflectance. In the second embodiment of the present invention, the third beam-splitting element 17 is first used to transmit the first parallel light beam to form an incident light for detecting a temperature of the substrate for growing an epitaxial film, and is also used to reflect the second reflected light to form the second parallel beam which can be received by the optical fiber 19. For the third beam-splitting element 17, the reflecting effect and the transmitting effect are equally important. Therefore, the third beam-splitting element 17 needs to be designed to have a 50% transmittance and a 50% reflectance.

As a specific implementation of the third beam-splitting element 17, the third beam-splitting element 17 may be a beam-splitting prism or a beam-splitting flat sheet.

In some embodiments, a wavelength of the N laser beams may be selected from any of the wavelengths of all common semiconductor lasers, including 405 nm, 532 nm, 633 nm, and 650 nm, 780 nm, and 980 nm. Since the light of these wavelengths is mostly visible light, the debugging of the laser is more convenient. Since the light emitted by the laser is visible light, the light spot finally projected and formed on the PSD 1 also has a same wavelength as the visible light, that is, it is easy to find the position of the spot at this time, thereby making it easier to detect the two-dimensional morphology of the wafer substrate for growing an epitaxial film.

The apparatus for automatically and quickly detecting a two-dimensional morphology of a wafer substrate in real time according to the second embodiment may further include a third calculation module. The laser receiving device transports the detected light intensity signal to the third calculation module, and the third calculation module calculates and obtains a real-time temperature of the wafer substrate according to the light intensity signal.

Therefore, according to the two-dimensional morphology of the wafer substrate and the real-time temperature of the wafer substrate obtained by multiple measurements, a distribution relationship between the two-dimensional morphology of the wafer substrate and the real-time temperature of the wafer substrate can be obtained.

Third Embodiment

An apparatus for quickly detecting a two-dimensional morphology of a wafer substrate in real time according to the third embodiment of the present invention differs from the first embodiment and the second embodiment of the present invention in that the apparatus for quickly detecting a two-dimensional morphology of a wafer substrate in real time according to the third embodiment of the present invention may further comprise a light passing device. The light passing device is disposed on an optical path through which both the incident light and the first reflected light beam pass, and the light passing device is provided with N light-passing holes, and there is a one-to-one correspondence between the N light-passing holes and the N laser beams. The light-passing holes are alternately provided with mirrors 11 to enable corresponding light beams passing therethrough to rotate by 90° in direction, thereby shifting corresponding PSDs to another direction to save a space for placement.

Figure 4:
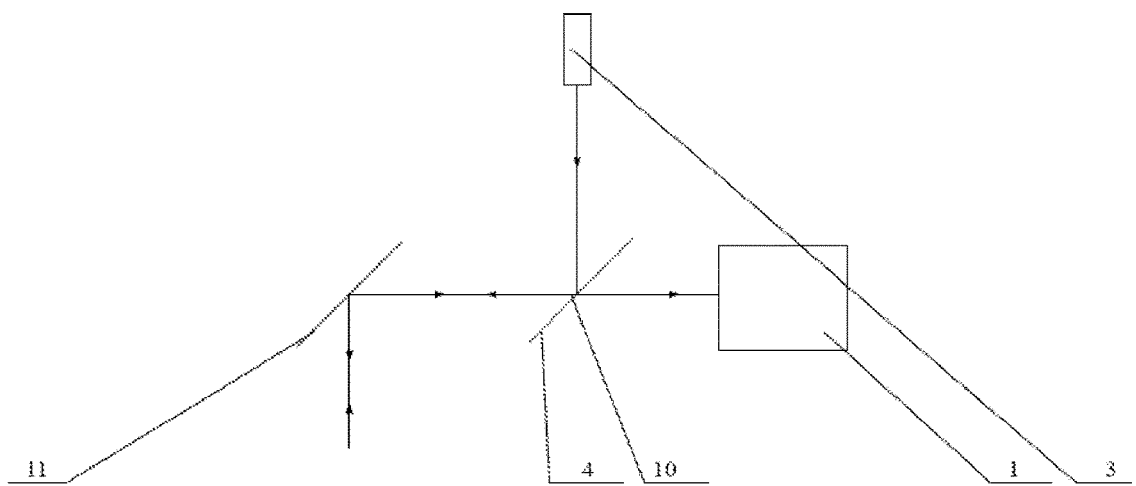
FIG. 4 is a schematic diagram showing an optical path of a third embodiment of an apparatus for automatically and quickly detecting a two-dimensional morphology of a wafer substrate in real time provided by the present invention, in which a mirror provided in a light-passing hole causes a light path to be rotated by 90°.

For easy understanding, FIG. 4 only shows a diagram of an optical path of one of light spots.

Referring to FIG. 4, a light beam emitted by respective first lasers 3 in an array of lasers is reflected by the first beam-splitting element 4 and then incident on the mirror 11, and then is reflected by the mirror 11 to form an incident light, and the incident light is incident on a wafer substrate to form N points of incidence on the wafer substrate in a radial direction. The incident light, after being reflected by the substrate, forms N first reflected light beams, and the respective first reflected light beams are reflected by the mirror 11 and then transmitted through the first beam-splitting element 4, and then incident on the PSDs 1 corresponding to the respective first lasers 3 to form N light spots.

In this embodiment, the mirror 11 can function to change the optical path, and thus cause the structure of the apparatus for quickly detecting a two-dimensional morphology of a wafer substrate in real time according to the second embodiment of the present invention to become more compact.

The objects, the technical solutions and the advantageous effects of the invention have been described in detail with reference to the above specific embodiments. It should be appreciated that the above embodiments are merely specific embodiments, but not intended to limit the invention. Any modifications, equivalent substitutions, improvements, etc., made within the spirit and principle of the invention should all be covered within the scope of the invention.

The invention claimed is:

1. An apparatus for detecting a two-dimensional morphology of a wafer substrate in real time, comprising:
   N PSDs, wherein the PSDs are Position Sensitive Devices;
   N laser beams, the N laser beams being arranged linearly;
   a first beam-splitting element;
   a second beam-splitting element and a temperature measurement device, wherein:
      the N laser beams are reflected by the first beam-splitting element and then incident on the second beam-splitting element, and form an incident light after passing through the second beam-splitting element, and the incident light is incident on the wafer substrate to form N points of incidence on the wafer substrate in a radial direction; the incident light after being reflected by the substrate forms N first reflected light beams, and wherein the first reflected light beams pass through the second beam-splitting element and the first beam-splitting element, and then are incident on the PSDs corresponding to the N laser beams to form N light spots;
      the temperature measurement device comprises a laser emitting device, a third beam-splitting element, and a laser receiving device;
   a first parallel light emitted by the laser emitting device is transmitted through the third beam-splitting element, and then transmitted through the second beam-splitting element to radiate on the wafer substrate and is reflected by the substrate to form a second reflected light beam; the second reflected light beam is transmitted through the second beam-splitting element, and then is reflected by the third beam-splitting element to form a second parallel light beam, and the second parallel light beam is received by the laser receiving device,
   wherein N is a natural number of 3 or more, and there is a one-to-one correspondence between the N PSDs and the N laser beams;
   wherein the N laser beams first irradiate on the first beam-splitting element, and form incident light after passing through the first beam-splitting element; the incident light is incident on the wafer substrate and forms N points of incidence on the wafer substrate in a radial direction; the incident light, after being reflected by the substrate, form N reflected light beams; and the first reflected light beams are transmitted through the first beam-splitting element, and then incident on PSDs corresponding to the N laser beams to form N light spots;
   wherein the apparatus is configured to detect two-dimensional morphology by:
   calculating a curvature $C_X$ between any two points of incidence on the wafer substrate in an X direction of a substrate to be detected according to position signals of the N light spots;
   calculating a curvature $C_Y$ of any point of incidence on the wafer substrate in a moving direction; and
   obtaining the two-dimensional morphology of the substrate according to calculation results of the respective $C_X$ and $C_Y$.

2. The apparatus of claim 1, wherein the apparatus is further configured to acquire coordinates of respective light spots and transport the coordinates of the respective light spots.

3. The apparatus of claim 2, wherein the $C_Y$ is calculated by the following formula:

$$C_Y = \frac{15f}{\pi} \cdot \frac{k}{RPM \cdot \alpha}$$

where,
$\alpha$ indicates a calibration coefficient,
k indicates a linearly fitted slope of longitudinal coordinates of light spots varying with time,
f indicates a sampling frequency of the respective PSDs, and
RPM indicates revolutions per minute of a graphite disc bearing the wafer substrate.

4. The apparatus of claim 1, wherein the $C_X$ is calculated by the following formula:

$$C_X = \frac{(x_{21} - x_{20})}{2 \cdot d_{AB} \cdot y_{20}} - \frac{(x_{11} - x_{10})}{2 \cdot d_{AB} \cdot y_{10}}$$

where,
$x_{10}$ indicates a horizontal coordinate of a light spot formed by a laser beam hitting on a planar reflection surface and then being reflected onto a first PSD,
$x_{20}$ indicates a horizontal coordinate of a light spot formed by a laser beam hitting on the planar reflection surface and then being reflected onto a second PSD,
$x_{11}$ indicates a horizontal coordinate of a light spot formed by a light hitting on the wafer substrate and then being reflected onto the first PSD,
$x_{21}$ indicates a horizontal coordinate of a light spot formed by a light hitting on the wafer substrate and then being reflected onto the second PSD,
$y_{10}$ indicates a distance from the first PSD to the wafer substrate,
$y_{20}$ indicates a distance from the second PSD to the wafer substrate, and $d_{AB} = x_{20} - x_{10}$.

5. The apparatus of claim 1, wherein the CY is calculated by the following formula:

$$C_Y = \frac{15f}{\pi} \cdot \frac{k}{RPM \cdot \alpha}$$

where,
$\alpha$ indicates a calibration coefficient,
k indicates a linearly fitted slope of longitudinal coordinates of light spots varying with time,
f indicates a sampling frequency of the respective PSDs, and
RPM indicates revolutions per minute of a graphite disc bearing the wafer substrate.

6. The apparatus of claim 1, wherein the N laser beams are emitted from N first lasers, and the N first lasers constitute an array of lasers.

7. The apparatus of claim 1, wherein N is a natural number of 5 or more.

8. The apparatus of claim 1, wherein,
the laser emitting device comprises a second laser, a launching fiber and a first lens, and the launching fiber is located at a focus of a launching end of the first lens; and the laser receiving device comprises a second lens, a receiving fiber and a detector, and the receiving fiber is located at a focus of a receiving end of the second lens.

9. The apparatus of claim 8, wherein a core diameter of the receiving fiber is larger than a core diameter of the launching fiber.

10. The apparatus of claim 1, wherein a splitting ratio of the first beam-splitting element is 50% transmittance versus 50% reflectance.

11. The apparatus of claim 1, wherein a splitting ratio of the second beam-splitting element is 92% transmittance versus 8% reflectance, and a splitting ratio of the third beam-splitting element is 50% transmittance versus 50% reflectance.

12. The apparatus of claim 1, wherein the third beam-splitting element is a beam-splitting prism or a beam-splitting flat sheet.

13. The apparatus of claim 1, wherein a wavelength of the N laser beams is selected from any of the wavelengths of common semiconductor lasers including 405 nm, 532 nm, 633 nm, 650 nm, 780 nm and 980 nm.

14. The apparatus of claim 1, further comprising a light passing device, wherein the light passing device is disposed on an optical path through which both the incident light and the first reflected light beam pass, and the light passing device is provided with N light-passing holes which have a one-to-one correspondence with the N laser beams; and the light-passing holes are alternately provided with mirrors to cause corresponding light beams passing therethrough to rotate by 90° in direction.

15. The apparatus of claim 1, wherein the apparatus is further configured to
receive light intensity signals from the laser receiving device; and calculate and obtain a real-time temperature of the wafer substrate according to the light intensity signals.

16. The apparatus of claim 1, wherein a splitting ratio of the first beam-splitting element is 50% transmittance versus 50% reflectance.

17. The apparatus of claim 1, wherein a wavelength of the N laser beams is selected from any of the wavelengths of common semiconductor lasers including 405 nm, 532 nm, 633 nm, 650 nm, 780 nm and 980 nm.

18. The apparatus of claim 1, further comprising a light passing device, wherein the light passing device is disposed on an optical path through which both the incident light and the first reflected light beam pass, and the light passing device is provided with N light-passing holes which have a one-to-one correspondence with the N laser beams; and the light-passing holes are alternately provided with mirrors to cause corresponding light beams passing therethrough to rotate by 90° in direction.

* * * * *